(12) United States Patent
Akamatsu et al.

(10) Patent No.: US 9,686,890 B2
(45) Date of Patent: Jun. 20, 2017

(54) ELECTRONIC DEVICE

(71) Applicant: Mitsubishi Electric Corporation, Chiyoda-ku, Tokyo (JP)

(72) Inventors: Shingo Akamatsu, Chiyoda-ku (JP); Mitsuo Sone, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 243 days.

(21) Appl. No.: 14/045,937

(22) Filed: Oct. 4, 2013

(65) Prior Publication Data

US 2014/0313673 A1 Oct. 23, 2014

(30) Foreign Application Priority Data

Apr. 22, 2013 (JP) .................. 2013-089068

(51) Int. Cl.
*H05K 7/20* (2006.01)
*H05K 1/02* (2006.01)
*H05K 3/00* (2006.01)

(52) U.S. Cl.
CPC ......... *H05K 7/2039* (2013.01); *H05K 1/0209* (2013.01); *H05K 7/205* (2013.01); *H05K 3/0061* (2013.01); *H05K 2201/10166* (2013.01); *H05K 2201/10272* (2013.01)

(58) Field of Classification Search
CPC .............................. H05K 1/0204; H05K 1/24
USPC ...... 361/676–678, 679.46–679.47, 688, 697, 361/713, 141, 700–710; 363/141, 144; 439/76.2
See application file for complete search history.

(56) References Cited

U.S. PATENT DOCUMENTS

| | | | |
|---|---|---|---|
| 4,768,075 A * | 8/1988 | Broich | H01L 25/18 257/133 |
| 6,373,705 B1 * | 4/2002 | Koelle | H01L 23/36 165/104.33 |
| 2004/0100808 A1 * | 5/2004 | Braun | H02K 11/046 363/144 |
| 2006/0138633 A1 * | 6/2006 | Naruse | H01L 24/72 257/688 |
| 2013/0182376 A1 * | 7/2013 | Ikezawa | F16B 37/04 361/637 |

FOREIGN PATENT DOCUMENTS

JP 2002-111260 A 4/2002

* cited by examiner

*Primary Examiner* — Tuan T Dinh
*Assistant Examiner* — Mukund G Patel
(74) *Attorney, Agent, or Firm* — Sughrue Mion, PLLC; Richard C Turner

(57) ABSTRACT

A structure for efficiently transferring heat generated from an electronic part or the like to a heat dissipation member is provided. A bus bar is used for a wiring pattern in an electronic device (60), such as a power line (2), a GND line (6) and the like. A heat transfer member (25) is held between a first bus bar that is a power line (2) connected to an electronic part and a second bus bar that is a GND line (6) connected to a heat dissipation member (7) to configure a heat dissipation structure in which heat generated from the electronic part is transferred through the power line (2), the heat transfer member (25) and the GND line (6) to the heat dissipation member (7).

11 Claims, 9 Drawing Sheets

ELECTRONIC DEVICE

BACKGROUND OF THE INVENTION

1. Field of the Invention

The present invention relates to an electronic device having a heat dissipation structure for efficiently dissipating heat generated from an electronic part or the like.

2. Description of the Background Art

In order to connect by wire parts composing a large-current circuit to each other, a conductive plate having a large electric power capacity what is called a bus bar is used. For an electronic device including a bus bar electrically connecting large-size electronic parts and a printed circuit board on which semiconductor parts and the like are mounted, heat generated from the electronic parts needs to be efficiently dissipated to the outside of the electronic device in order to suppress the temperature increase of the electronic parts to ensure their stable operation. However, in the electronic device including the bus bar and the printed circuit board, a heat transfer path from an electronic part to a heat dissipation member is local, such as a contact portion of the printed circuit board and the heat dissipation member, with respect to the surface area of the heat dissipation member on the side of the inside of a case of the electronic device, so heat transfer to the whole heat dissipation member is difficult. Thus, conventionally, heat transfer to the outside of the electronic device effectively utilizing the whole surface area of the heat dissipation member has not been achieved.

Furthermore, the heat dissipation structure of conventional electronic devices is such that a heat dissipation area having an increased area is formed at the connection part of GND terminals of electronic parts, such as ICs and semiconductors, on the printed circuit board and a ground line of the board to transfer heat generated from the electronic parts to the heat dissipation area and dissipate heat from the heat dissipation area to the outside. Furthermore, in the conventional electronic devices, in order to enhance heat dissipation capability, the surface area of the heat dissipation area is varied depending on the amount of heat generation, and the heat dissipation area that is a ground line is connected to the heat dissipation member of the electronic device with a heat transfer member, such as a jumper wire or heat conductive harness (for example, see Patent Document 1).

[Patent Document 1] JP-A-2002-111260

However, the heat dissipation structure disclosed in JP-A-2002-111260 has a problem of the increased area of the heat dissipation area causing the board to be large size when the amount of heat generation of the electronic parts is large. Furthermore, in semiconductor devices, such as a power converter mounted on an electric vehicle or HEV, the amount of heat generation from a switching device or the like mounted on the board tends to increase with respect to the conventional electronic devices. Furthermore, as described above, heat is transferred from a large-size and high-heat-generating electronic part, such as a reactor, connected with a bus bar to another electronic part or vice versa through a wiring pattern, so a conventional heat dissipation means alone cannot be expected to sufficiently cool all of the electronic parts.

In other words, the issue is that it is necessary for an electronic device that consumes high amount of power and generates high amount of heat to efficiently cool electronic parts mounted on the board, and furthermore, not limited to the electronic parts, but all of the parts connected by a wiring pattern in order to reliably prevent false operation, distortion, shortened life and noise generation due to the temperature increase of all of the electronic parts.

SUMMARY OF THE INVENTION

In order to solve the above problem, it is an object of the present invention to provide an electronic device that can use a bus bar that is a wiring pattern for electronic parts as a heat dissipation path and expand the heat dissipation path by adding a simple modification to the electronic device to improve heat dissipation performance.

An electronic device in accordance with the invention includes: a first bus bar forming a power line and connected to an electronic part; a second bus bar forming a GND line and connected to a heat dissipation member; and an insulating heat transfer member placed between the first and second bus bars.

Advantage of the Invention

The electronic device of the invention has a heat dissipation path for transferring heat generated from an electronic part or the like through a heat transfer member and a bus bar to a heat dissipation member, thereby enabling efficient heat dissipation.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

First Embodiment

The heat dissipation structure of an electronic device of a first embodiment of the invention is described with reference to FIGS. 1-3. Note that the first embodiment is described with reference to the simplified drawings of an on-vehicle power converter as the electronic device, however any electronic device using a bus bar for connecting a plurality of circuit parts in any other field may apply a similar heat dissipation structure.

The electronic device of the first embodiment of the invention is an electronic device including a plurality of electronic parts connected by connection wires including a bus bar, in which two types of bus bars including a power line that is a current path and a GND line serving as GND and a heat dissipation member that is a common GND of the electronic device are arranged in a layered structure, then heat generated from the power line and the electronic parts is transferred to the GND line through an insulating heat transfer member, and then the heat transferred to the GND line is transferred to the heat dissipation member connected to the GND line.

Figure 1:
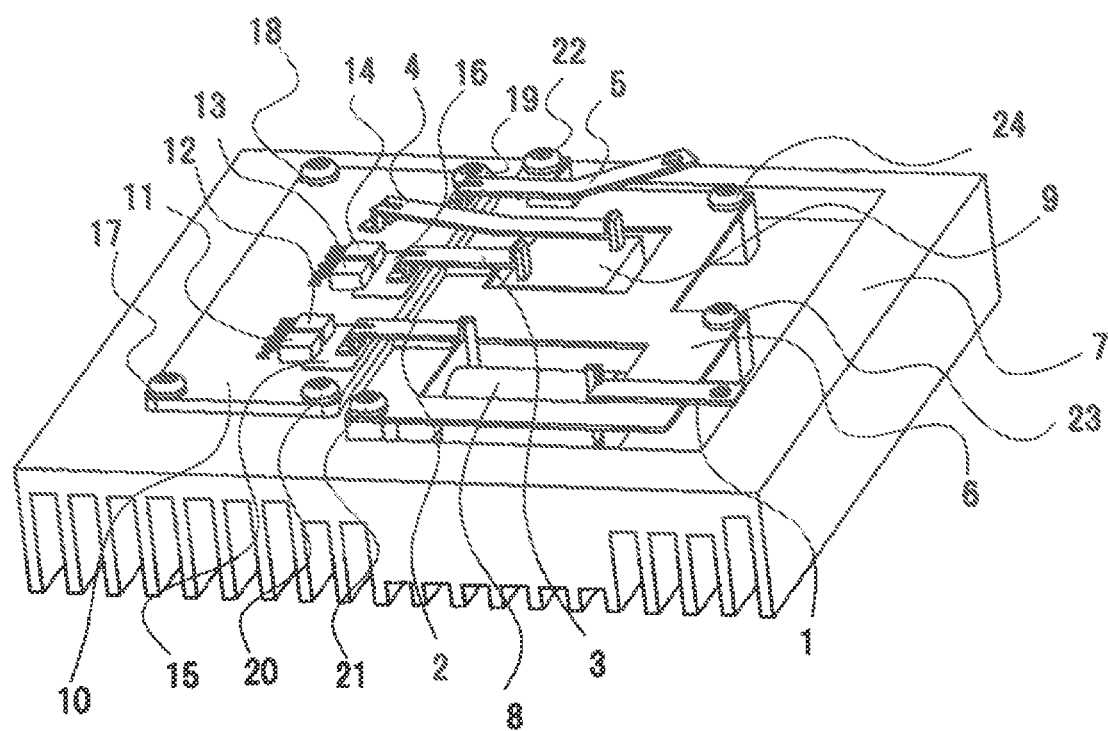
FIG. 1 is a perspective view of an electronic device in accordance with a first embodiment of the invention.
Figure 2A:
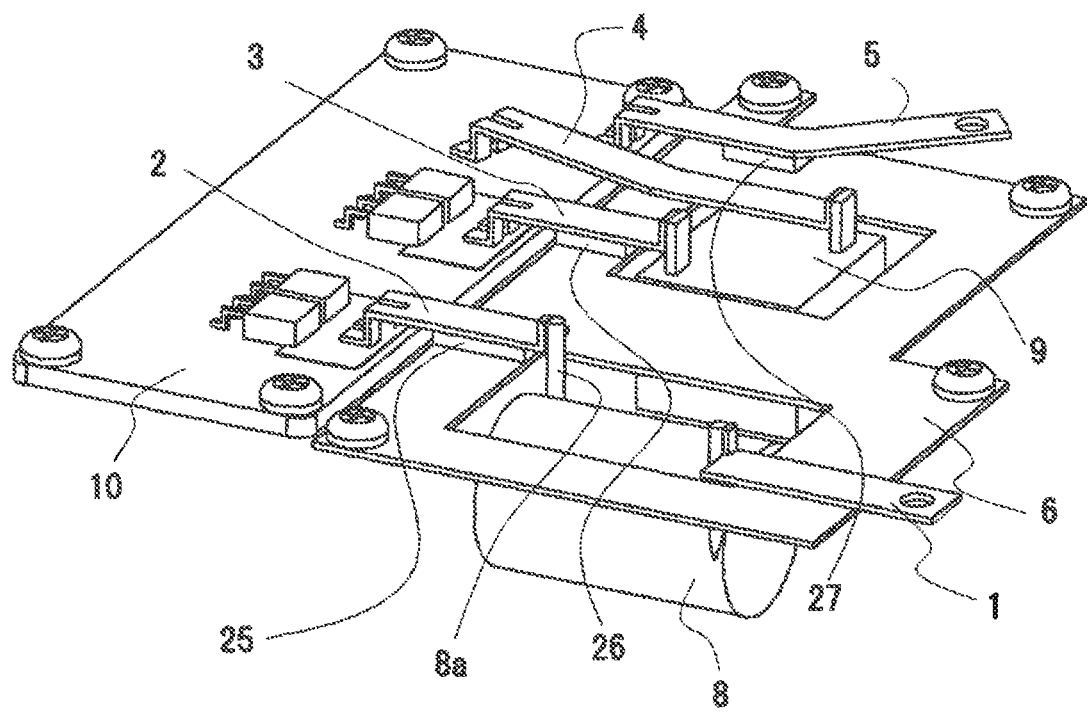
FIG. 2A is an exploded perspective view and FIG. 2B is a main part cross-sectional side view illustrating a heat dissipation path, of the electronic device in accordance with the first embodiment of the invention.
Figure 2B:
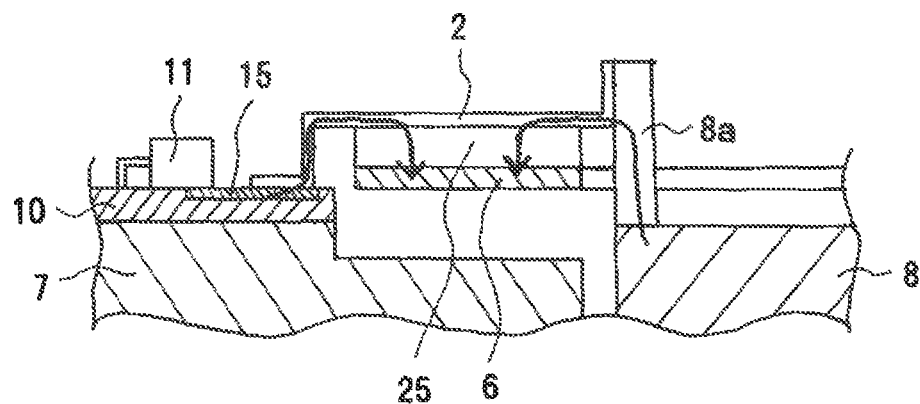

FIG. 1 is a perspective view of an electronic device 60 that is, for example, an on-vehicle power converter. FIG. 2A is a perspective view of the electronic device 60 from which a heat dissipation member 7 is removed. FIG. 2B is a main part cross-sectional view showing a heat dissipation path using a heat transfer member 25 and the like. FIG. 3 is a perspective view of the heat dissipation member 7.

As shown in the figures, the electronic device 60 includes as an electronic part a choke coil 8 and a reactor 9 that are a coil and switching devices 11, 12, 13 and 14 mounted on the printed circuit board 10. These parts are connected by bus bars (1-6) that are plate-like wires.

More specifically, the electronic device 60 includes a circuit in which the printed circuit board 10 on which the switching devices 11-14 are mounted, the choke coil 8 and the reactor 9 are electrically connected by wiring patterns 15 and 16, power lines 1-5 and a GND line 6 that are made of a conductive material. In this example, among the bus bars, a bus bar in which current flows is called a power line (corresponding to a first bus bar), and a bus bar serving as a GND is called a GND line (corresponding to a second bus bar).

In this example, the choke coil 8, the reactor 9 and the switching devices 11-14 are an electronic part that generates high amount of heat. The printed circuit board 10 is fastened and fixed to the heat dissipation member 7 with screws 17-20, in which the GND pattern on the printed circuit board 10 is connected to the heat dissipation member 7 that is the common GND of the electronic device 60 by the screws 17-20.

Figure 3A:
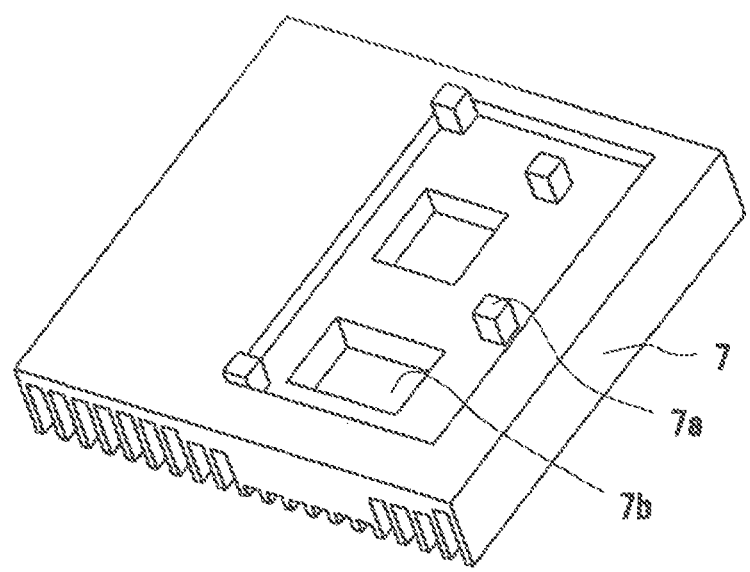
FIG. 3A and FIG. 3B are perspective views showing a heat dissipation member of the electronic device in accordance with the first embodiment of the invention.
Figure 3B:
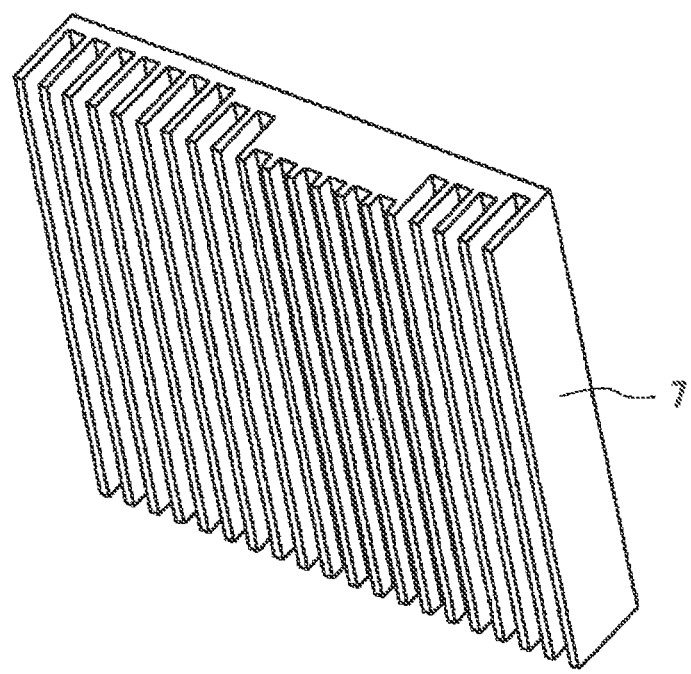

As shown in FIG. 3A, the heat dissipation member 7 is made of aluminum and includes a convex portion 7a to which the GND line 6 is to be fixed and a concave portion 7b in which the choke coil 8 and the reactor 9 are to be placed, which are formed on the mounting surface. Furthermore, as shown in FIG. 3B, the back side of the heat dissipation member 7 generally has a heat sink structure in which a plurality of fins are provided to increase the surface area, thereby enhancing the effect of transferring heat to the ambient air.

The choke coil 8 and the reactor 9 are placed in the concave portion 7b that is a recessed area provided in the heat dissipation member 7. The clearance between the choke coil 8 and reactor 9 and the heat dissipation member 7 is filled with a silicone resin or the like to enhance heat transfer performance, insulation performance and vibration resistant performance of the choke coil 8 and reactor 9 and the heat dissipation member 7. Part of heat generated from the choke coil 8 and the reactor 9 is transferred to the heat dissipation member 7 through a resin material. The power lines 1-4 that are the first bus bars are the connection wires of the choke coil 8 and the reactor 9 on the current input/output side.

The power lines 2, 3 and 5 that is the first bus bars are connected to the GND line 6 that is the second bus bar by insulating heat transfer members 25, 26 and 27. In other words, the heat transfer members 25-27 are held between the flat portions of the overlapping first and second bus bars (denoted by the reference numerals 1-5 and 6). Note that heat transfer members are also placed between the flat portions of the power lines 1 and 4 and the flat portions of the GND line 6, but these heat transfer members are not shown in FIG. 1 and the like.

Note that, in the inter-bus bar connection area (the overlapping area in which the first and second bus bars are overlapping with the heat transfer members in between), for example, three layers of the GND line 6, the heat transfer member 25 and the power line 2 are stacked in this order on the heat dissipation member 7.

Since the heat dissipation member 7 is the common GND of the overall electronic device 60, the heat dissipation member 7 is not electrically affected by the connection with the GND line 6. The heat transfer members 25-27 are made of a material having advantages including heat conductivity, electric insulation, flexibility, adhesion, heat resistance and incombustibility, such as silicone material, acrylate resin, graphite and the like.

Furthermore, the GND line 6 is connected to the heat dissipation member 7 that is the common GND of the electronic device 60 with screws 21-24 that are fastening members. This connection grounds the circuit and also fixes the GND line 6 to the heat dissipation member 7 with the screws 21-24 to provide vibration resistant performance and transfer heat from the GND line 6 to the heat dissipation member 7 at the connection points.

For example, the bus bar is made of a copper material that is better in electric conductivity and heat conductivity than aluminum of which the heat dissipation member 7 is made. Due to this, heat can be more largely diffused in a shorter time within the bus bar than within the heat dissipation member 7.

Furthermore, the GND line 6 is formed to have a total area larger than the total area of the power lines 1-5. Due to this, the screw fastening points at which thermal connection with the heat dissipation member 7 is performed can be provided distributed across several points of the GND line 6, which can diffuse heat over a wide area of the heat dissipation member 7 and can increase the heat capacity of the GND line 6, thereby suppressing the temperature increase of the bus bar.

Now, the heat dissipation path using the heat transfer member 25 is described in detail with reference to FIG. 2B. As described above, heat generated from the switching devices 11 that is an electronic part is dissipated by the heat dissipation path in which the heat is transferred through the wiring pattern 15, the power line 2 and the heat transfer member 25 to the GND line 6. Another heat dissipation path than this heat dissipation path may also be configured in which, for example, the heat transfer member 25 is placed near the choke coil 8 that is a high-heat-generating part, then heat generated from the choke coil 8 is transferred to the power line 2 through a wire 8a, and then the heat is transferred to the GND line 6 through the heat transfer member 25 with the shortest transfer distance (the heat dissipation direction is denoted by an arrow in FIG. 2B).

Expanding the heat dissipation path in this way can reduce the temperature increase of other electronic parts including the power lines 2 and 3 around the heat-generating parts and the switching devices 11-14, an electrolytic capacitor and the like on the printed circuit board 10 connected to the power lines 2 and 3.

Furthermore, the heat transfer parameters including the heat conductivity of the heat transfer members 25-27, the contact area between the power lines 1-5 and the GND line 6 and the like can be effectively changed according to the desired amount of heat dissipation.

For example, when the amount of heat generation of the reactor 9 is large and the amount of heat generation of the choke coil 8 is small, a material having a small heat conductivity is selected and used for the heat transfer member 25, and a material having a large heat conductivity is selected and used for the heat transfer member 26. This can reduce the temperature increase of the reactor 9 and can control the temperature increase of the heat dissipation member 7 around the choke coil 8 and the reactor 9 and the used amount of a silicone resin filling the clearance between the choke coil 8 and reactor 9 and the heat dissipation member 7.

Furthermore, setting the connection point of the GND line 6 and the heat dissipation member 7 to a position physically far away from the heat-generating part (for example, the positions of screws 24 and 23) may also be effective for enhancing heat dissipation performance. Specifically, selecting a position on the heat dissipation member 7 unlikely to be affected by direct heat transfer from the heat-generating part as a screw fastening point to transfer heat causes heat from the heat-generating part to be uniformly transferred throughout the heat dissipation member 7, which can effectively utilize the whole surface area of the heat dissipation member 7 to dissipate heat to the ambient air.

Furthermore, in the first embodiment of the invention, the amount of heat transfer can be optimized taking into consideration all of the heat dissipation design parameters including the heat resistant temperature of the electronic parts and the heat capacity of the heat dissipation member and bus bar, so an effect such as space saving and cost saving through the reduction in volume of the power lines 1-5, the GND line 6 and the heat dissipation member 7 can be expected.

Furthermore, when the power lines 1-5 and the GND line 6, both of which are bus bars, are placed in parallel to each other, an induced current flows in the GND line that is a dielectric conductor in the inverse direction and with the same amount with respect to a current flowing in the power line that is a wiring conductor, so the wiring inductance will be reduced, providing an effect of reducing a loss in the power line and radiation noise from the power line.

Furthermore, the layered structure of the two types of bus bars (power lines 1-5 and GND line 6) and the heat transfer member (25) is not limited to the above-described three-layer structure, but may have more layers including a plurality of power lines or a plurality of GND lines. The connection condition of the heat dissipation path including the power lines 1-5 and the GND line 6 can be varied according to the arrangement of the heat transfer members 25-27 and can be appropriately controlled.

As described above, the electronic device 60 of the first embodiment includes: the first bus bar including the power lines 1-5 and connected to the electronic parts; the second bus bar including the GND line 6 and connected to the heat dissipation member 7; and the insulating heat transfer members 25-27 placed between the first and second bus bars, in which with the heat dissipation structure of the heat transfer members 25-27 held between the flat portion formed in the first bus bar and the flat portion formed in the second bus bar, even when an electronic part that generates a large amount of heat is connected to the other electronic parts by the first bus bar that are the power lines 1-5 having high heat conductivity, the first bus bar is connected to the second bus bar that is the GND line 6 by the heat transfer members 25-27, causing heat generated from the electronic part that generates a large amount of heat to be transferred to the second bus bar, which can suppress heat transfer to the other electronic parts to suppress the temperature increase of the other electronic parts.

In addition to the heat transfer path through the contact surface with the printed circuit board 10 and through the resin filling the clearance between the heat dissipation member 7 and the choke coil 8 and reactor 9, the heat transfer from the heat-generating parts to the heat dissipation member 7 may be performed through the bus bar and the heat transfer members 25-27. Thus expanding the heat dissipation path can suppress the bias of temperature distribution in the heat dissipation member 7 to a small extent to enable efficient heat dissipation fully utilizing the surface area of the heat dissipation member 7.

Second Embodiment

Figure 4:
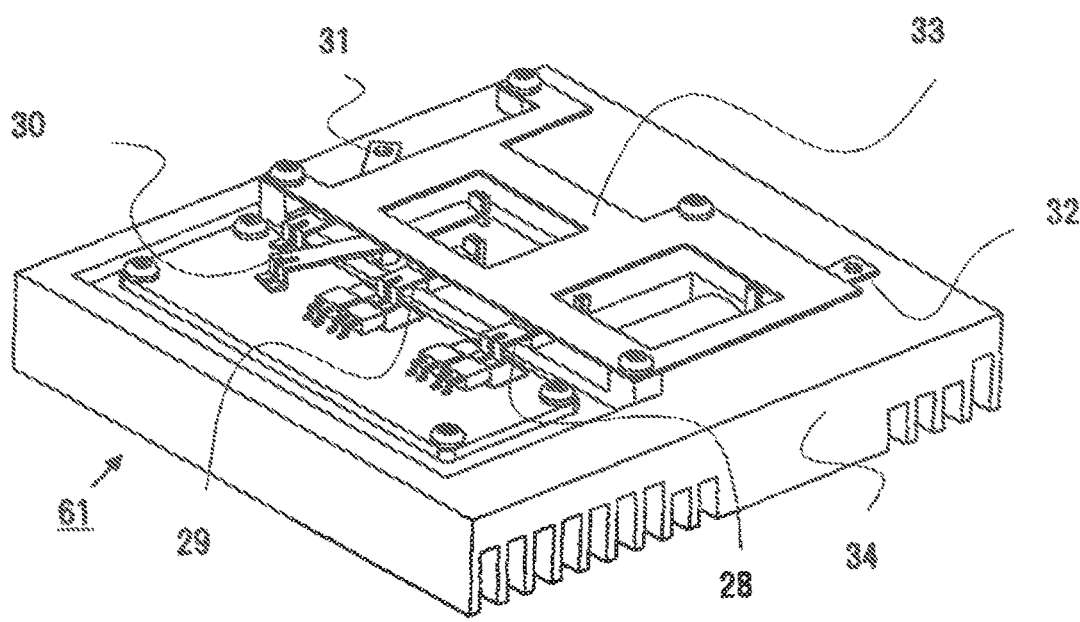
FIG. 4 is a perspective view of an electronic device in accordance with a second embodiment of the invention.
Figure 5A:
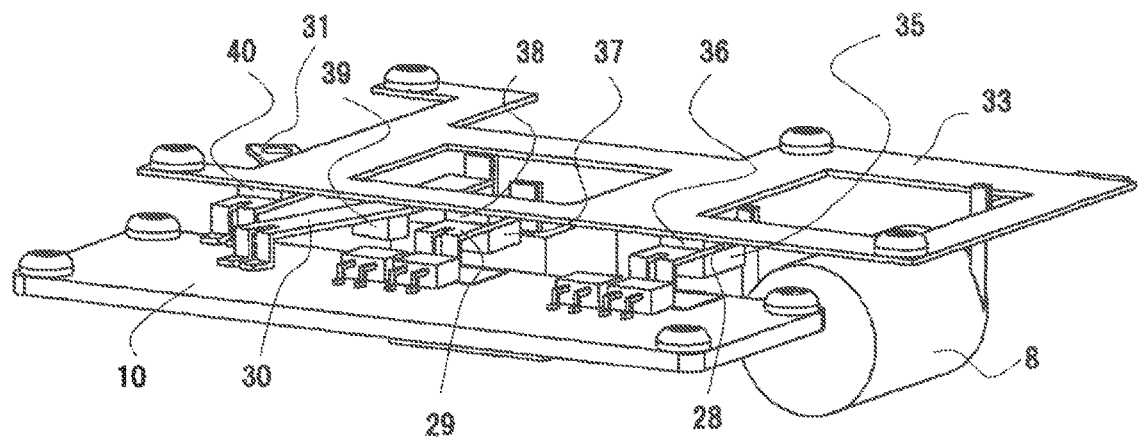
FIG. 5A is an exploded perspective view and FIG. 5B is a main part cross-sectional side view illustrating a heat dissipation path, of the electronic device in accordance with the second embodiment of the invention.
Figure 5B:
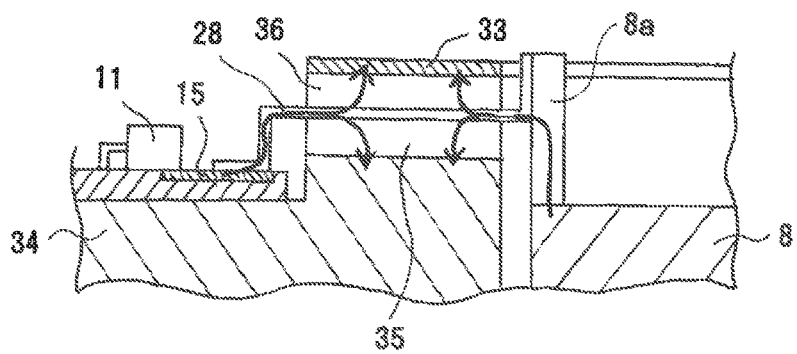

FIGS. 4 and 5 are a perspective view (FIG. 4), a partial perspective view (FIG. 5A) and a main part cross-sectional side view showing a heat dissipation path (FIG. 5B) of an electronic device 61 in accordance with a second embodiment of the invention.

The above-described first embodiment shows the electronic device 60 in which the second bus bar that is the GND line 6, the heat transfer member 25, the first bus bar that is the power line 2 are stacked in this order on the heat dissipation member 7 that is the base, and shows the heat dissipation path from the upper surface side (in FIG. 1 and the like) to the lower surface side of the heat transfer member 25. On the other hand, as shown in FIGS. 4 and 5, the electronic device 61 in accordance with the second embodiment includes members stacked in a different order, in which a first bus bar that is a power line 28 (29, 30, 31, 32), a heat transfer member 36 (38, 40) and a second bus bar that is the GND line 33 are stacked in this order on a heat dissipation member 34, configuring the heat dissipation path from the lower surface side to the upper surface side of the heat transfer member 36.

With the GND line 33 as the top layer, the layered structure including the heat transfer members of the second embodiment is a structure suitable for increasing the degree of freedom for designing the GND line, such as extending the GND line to the outside for connection as described later in a fourth embodiment. Furthermore, in this structure, the power lines 28 and 29 connected to a heat-generating part, such as a coil, placed in the concave portion of the generally plate-like heat dissipation member 34 are placed near the surface of the heat dissipation member 34 to shorten the distance between the heat dissipation member 34 and the power lines 28 and 29, thereby forming the heat dissipation path from the lower surface side to the upper surface side of the heat transfer members 36 and 38, which enhances heat transfer performance.

The heat dissipation structure of the electronic device 61 in accordance with the second embodiment of the invention is described in detail. As shown in FIGS. 4 and 5A, heat is transferred from the power lines 28, 29 and 31 through the heat transfer members 36, 38 and 40 to the GND line 33. Furthermore, as described above, the GND line 33 is connected to any appropriate portion of the heat dissipation member 34 for transferring heat to the heat dissipation member 34, which fully utilizes the whole surface area of the heat dissipation member 34 to transfer heat to the ambient air.

Note that, when the amount of heat generated from around the power lines 28-30 is small and the local temperature increase of the heat dissipation member 34 is not a concern, or when the GND line 33 cannot be placed near a portion to be cooled of the power lines 28-30, or when an insufficient heat capacity of the GND line 33 is a concern, the power lines 28-30 are connected to the heat dissipation member 34 by a short path through heat transfer members (other heat transfer members) 35, 37 and 39. This can transfer heat from the power lines 28-30 through the heat transfer members 35, 37 and 39 to the heat dissipation member 34, i.e., through a path shorter than the path via the GND line 33.

According to the above-described configuration, heat is partially transferred from the power lines 28-32 through the heat transfer members 35, 37 and 39 to the heat dissipation member 34. In this configuration, the distance between the power lines 28-32 and the heat dissipation member 34 can be varied depending on the thickness of the heat transfer members 35, 37 and 39, and can be the shortest with the minimum thickness of the heat transfer members 35, 37 and 39. The minimum thickness of the heat transfer members 35, 37 and 39 also shortens the time taken for heat transfer within the members. Also, cost reduction may be expected from the smaller thickness of the material.

Furthermore, this heat dissipation structure in which the power line is connected to the heat dissipation member through the heat transfer member can decrease the amount of heat transferred to the GND line to downsize the GND line itself with respect to the heat dissipation structure of the first embodiment in which heat generated within the device is transferred to the heat dissipation member through the power line and the GND line. This achieves reduction in the cost of parts of the GND line 33, space saving within the electronic device 61 by reducing the area of the GND line 33, increasing the degree of freedom of the part layout by expanding the heat dissipation path and the like.

The heat dissipation structure of the second embodiment and the heat dissipation path provided by this structure are shown in the main part cross-sectional side view in FIG. 5B. As shown in FIG. 5B, heat generated from a switching device 11 that is an electronic part is transferred through the power line 28 and then through two paths. One of the paths transfers heat from the power line 28 through the heat transfer member 36 to the GND line 33, while the other transfers heat from the power line 28 through the heat transfer member 35 to the heat dissipation member 34 over a shorter distance. When the heat-generating part is a choke coil 8, heat is transferred to the power line 28 through a wire 8a that is an input/output wire of the choke coil 8, then transferred through the path for dissipating heat toward the GND line 33 (in the upward direction in FIG. 5B) and the path for dissipating heat toward the heat dissipation member 34 (in the downward direction in FIG. 5B) as described above. Needless to say, the heat conductivities of the heat transfer members 35 and 36 can be individually adjusted.

Also in the second embodiment, as with the first embodiment, the positions of the screws that are fastening members (the screws for fixing the GND line 33 to the heat dissipation member 34) can be distributed in the plane of the GND line 33 to disperse heat across the heat dissipation member 34. Furthermore, as a variation of this, any appropriate portion may be used as a screw fastening point to transfer heat from the portion, such as a low-temperature portion of the heat dissipation member 34, a portion having a large surface area due to height difference from a fin height or the like from which high heat-dissipation performance can be expected, a position from which convection of the ambient air of the heat dissipation member 34 can be expected and the like.

Third Embodiment

Figure 6A:
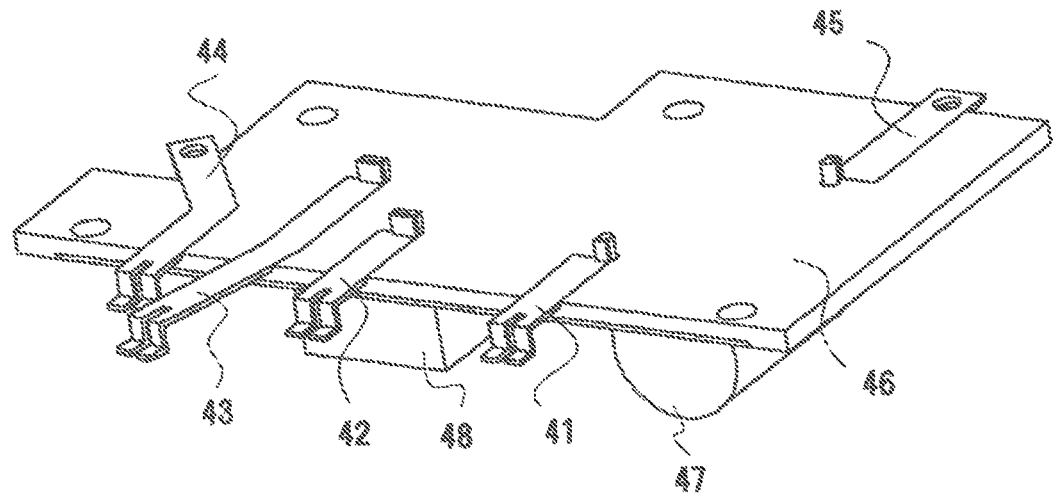
FIG. 6A and FIG. 6B are exploded perspective views of an electronic device in accordance with a third embodiment of the invention.
Figure 6B:
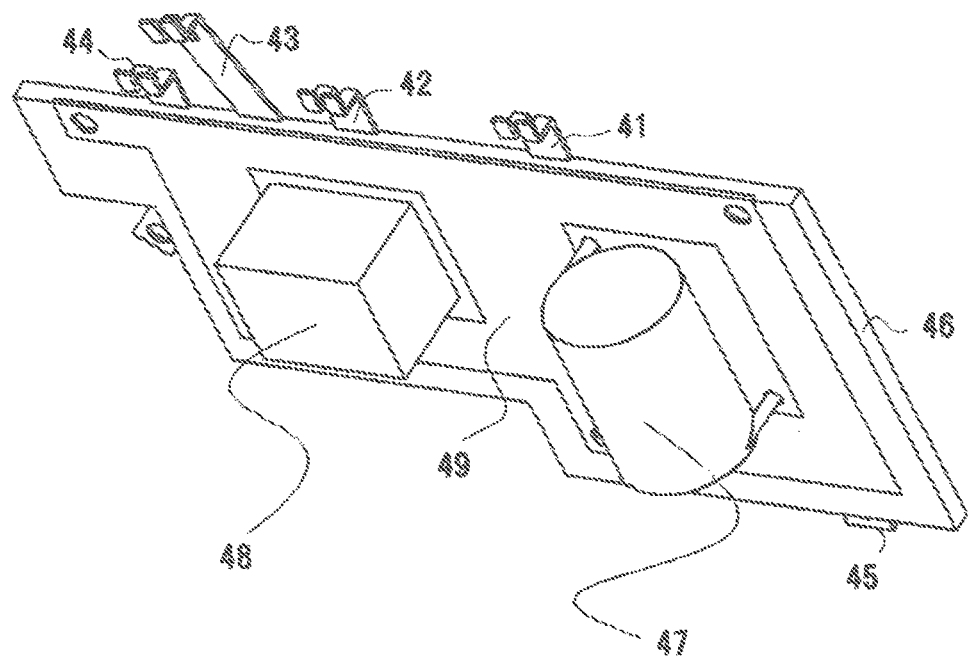
Figure 7A:
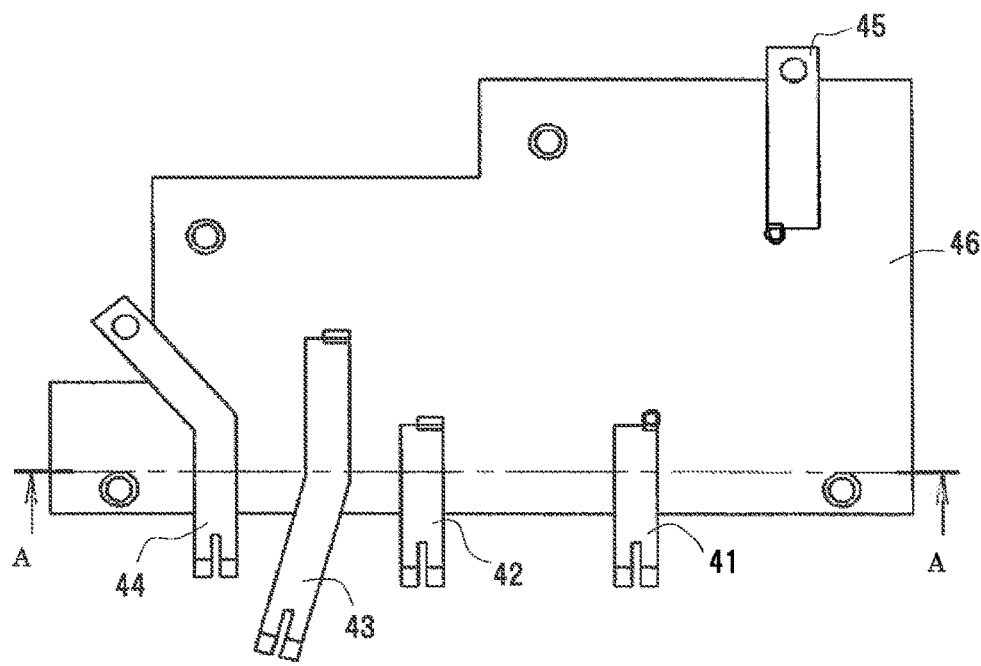
FIG. 7A is a partial plan view and FIG. 7B is a partial cross-sectional view of the electronic device in accordance with the third embodiment of the invention.
Figure 7B:
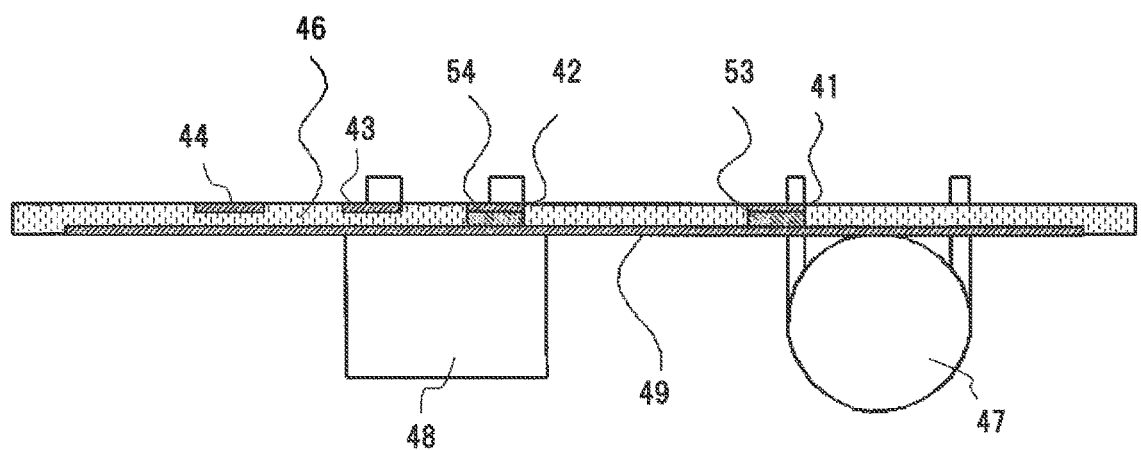

FIGS. 6 and 7 are partial perspective views (FIGS. 6A and 6B), a partial plan view (FIG. 7A) and a partial cross-sectional view (FIG. 7B) of an electronic device of a third embodiment of the invention. FIG. 7B corresponds to the A-A cross-sectional view of FIG. 7A.

In the above described first and second embodiments, the power lines and GND line that are bus bars are an electronic device wiring structure of a type in which the ends and the like are fastened and fixed to the connection points and the other wiring portions are in contact with no other portion. However, the heat dissipation structure of the third embodiment to be described is an electronic device wiring structure of a type in which a bus bar is fastened to a molded member composed of a resin or the like.

As shown in FIGS. 6 and 7, copper terminals that are a conductive material of which power lines 41-45 and a GND line 49 are composed are fixed to a molded member (resin-molded member) 46 composed of a PBT resin (resin material) or the like by inserting or outserting, so the power lines 41-45 and the GND line 49 are kept insulated from one another by the molded material. Furthermore, using terminal insertion holes provided on the molded member 46 for the bus bars fixed to the molded member 46, electronic parts, such as a choke coil 47 and a reactor 48, are positioned and welded, which electrically connects the bus bars to the electronic parts. Due to this, the molded member, the bus bars and the electronic parts form an ASSY.

In the third embodiment, as shown in FIG. 7B, part of the molded member 46 positioned where the bus bars are overlapping is removed, and heat transfer members 53 and 54 for connecting the power lines 41 and 42 to the GND line 49 are placed so as to pass through the molded member 46. This structure allows the heat transfer members 53 and 54 to be reliably positioned, the flexible heat transfer members 53 and 54 to be sandwiched between the bus bars (the power lines 41 and 42 and the GND line 49) and compressed, thereby enhancing the adhesion to the bus bars, and heat to be reliably transferred from the power lines 41 and 42 through the heat transfer members 53 and 54 to the GND line 49.

Fourth Embodiment

Figure 8:
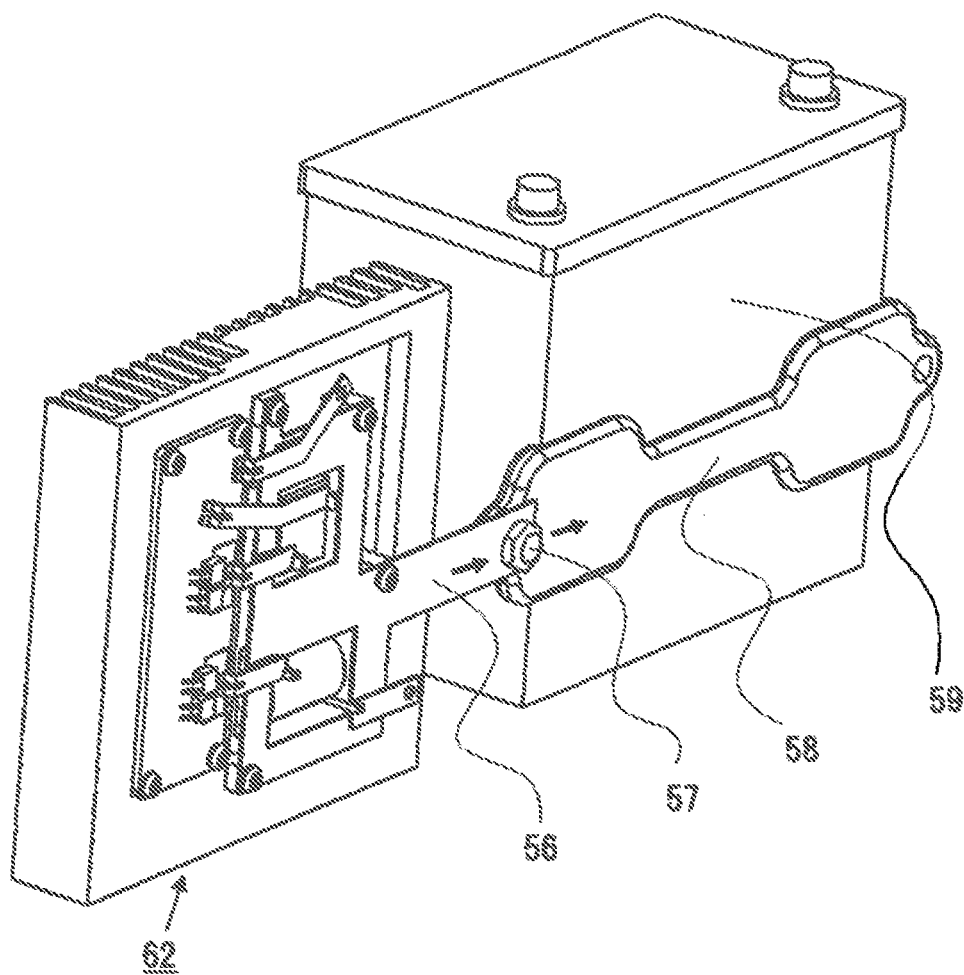
FIG. 8 is a perspective view showing the connection between an electronic device in accordance with a fourth embodiment of the invention and a peripheral device.

FIG. 8 shows a heat dissipation structure of an electronic device 62 in accordance with a fourth embodiment of the invention. According to the structure, a GND line (a second bus bar) 56 is connected to a GND common to the electronic device 62 and a peripheral device 59 external to the electronic device 62 to transfer heat to the external part 59. The example in FIG. 8 shows the connection using a screw 57 to a bracket 58 for fixing a battery (the external part 59) in an engine room. This heat dissipation structure can suppress the temperature increase of electronic parts and heat dissipation members within the electronic device 62. This may provide an advantage, such as reduction in the volume and surface area of the heat dissipation members, elimination of an external device for forced air cooling of the heat dissipation members, and the like. Furthermore, connecting the GND line 56 to the external part 59 causes the electronic device 62 to be more firmly fixed.

Fifth Embodiment

Figure 9A:
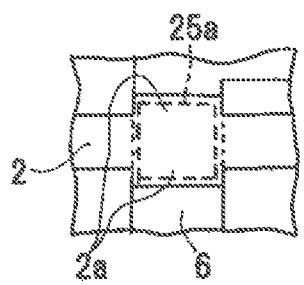
FIG. 9A and FIG. 9B are plan views and FIG. 9C is a cross-sectional view showing a variation of an area in which bus bars are overlapping in accordance with a fifth embodiment of the invention.
Figure 9B:
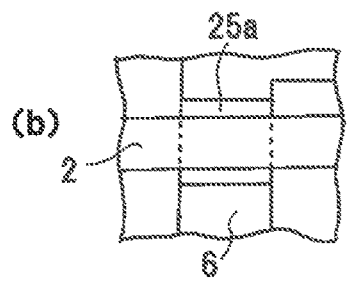
Figure 9C:
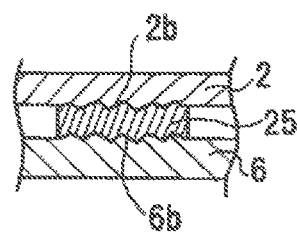

A fifth embodiment is described that is a variation of the area in which the bus bars are overlapping. FIGS. 9A and 9B are plan views showing an area in which first and second bus bars are overlapping and the bus bars are joined to a heat transfer member. FIG. 9C is a cross-sectional view of this area. FIG. 9A is an enlarged top view of an area in which a power line 2 that is a first bus bar is placed on a GND line 6 that is a second bus bar with a heat transfer member 25*a* in between. In the above-described first to fourth embodiments, the bus bars are illustrated to be plate-like wires having generally the same width. However, in FIG. 9A, in order to increase the junction area between the bus bars to enhance heat transfer performance, the wire width is increased only in a portion corresponding to the junction, then a wire-width-increased portion denoted by a reference numeral 2*a* is formed, and then the heat transfer member 25*a* is formed with a wider area according to the increased wire width. Needless to say, the heat transfer performance varies depending on the dimension of the wire-width-increased portion 2*a*.

FIG. 9B shows a condition in which, when, for example, the wiring pattern of the power line 2 cannot be varied, the heat transfer member 25*a* to be placed at the junction of the bus bars is formed to be larger than the wire width of the power line 2 to increase the junction area with the heat transfer member 25*a* on the GND line 6 side, thereby enhancing heat transfer performance.

FIG. 9C is a cross-sectional view showing the cross-sectional structure of the connection between the two bus bars in a simplified manner. As shown, concavity and convexity is provided to the surface of the bus bars (the power line 2 and the GND line 6) in contact with the heat transfer member 25 to form concave-convex surfaces 2*b* and 6*b*, thereby increasing the surface area of the bus bars at the connection, which allows the joining surface with the heat transfer member 25 to be expanded, the junction strength to be enhanced, the junction area to be increased, and the heat dissipation performance to be enhanced.

Note that the embodiments of the invention may be freely combined or appropriately modified or omitted within the scope of the invention.

Various modifications and alterations of this invention will be apparent to those skilled in the art without departing from the scope and spirit of this invention, and it should be understood that this is not limited to the illustrative embodiments set forth herein.

What is claimed is:

1. An electronic device comprising:
    a first bus bar that is plate-like wire forming a power line and connected to an electronic part;
    a second bus bar that is plate-like wire forming a ground line and connected to a heat dissipation member; and
    an insulating heat transfer member placed between the first and second bus bars,
    wherein the insulating heat transfer member performs heat transfer between the first and second bus bars,
    wherein the second bus bar and the heat dissipation member are fixed and connected at any appropriate point with a fastening member,
    wherein on the second bus bar, the insulating heat transfer member and the fastening member are separated from each other in a direction parallel to a plane of the second bus bar,
    wherein the heat transfer member is held between a flat portion formed in the first bus bar and a flat portion formed in the second bus bar, and
    wherein a flat portion formed in the first bus bar and a flat portion formed in the second bus bar are placed in parallel to each other.

2. The electronic device according to claim 1, wherein a total area of the second bus bar is larger than that of the first bus bar.

3. The electronic device according to claim 1, wherein the second bus bar, the heat transfer member and the first bus bar are stacked in this order on the heat dissipation member.

4. The electronic device according to claim 1, wherein the first bus bar, the heat transfer member and the second bus bar are stacked in this order on the heat dissipation member.

5. The electronic device according to claim 4, wherein the first bus bar is connected to the heat dissipation member through another heat transfer member.

6. The electronic device according to claim 1, wherein the heat transfer member is formed of at least one material of silicone material, acrylate resin and graphite.

7. The electronic device according to claim 1, wherein copper is used for a material of the first and second bus bars, and aluminum is used for a material of the heat dissipation member.

8. The electronic device according to claim 1, comprising a resin molded member composed of a resin material, placed between the first and second bus bars,
    wherein the heat transfer member is placed so as to pass through the resin molded member and performs heat transfer between the first and second bus bars.

9. The electronic device according to claim 1, wherein the first bus bar is a connection wire on a current input side or a current output side connected to a coil that is the electronic part.

10. The electronic device according to claim 1, wherein the second bus bar is connected to a ground common to the electronic device and a peripheral device.

11. The electronic device according to claim 1, wherein the heat dissipation member is a common ground of the overall electronic device.

\* \* \* \* \*